United States Patent [19]

Weber

[11] Patent Number: 5,309,309
[45] Date of Patent: May 3, 1994

[54] SEMICONDUCTOR PROTECTION AGAINST HIGH ENERGY TRANSIENTS

[75] Inventor: Charles F. Weber, South Lyon, Mich.

[73] Assignee: Ford Motor Company, Dearborn, Mich.

[21] Appl. No.: 903,301

[22] Filed: Jun. 24, 1992

Related U.S. Application Data

[63] Continuation-in-part of Ser. No. 745,621, Aug. 15, 1991, abandoned.

[51] Int. Cl.$^5$ .............................................. H02H 9/06
[52] U.S. Cl. ...................................... 361/18; 361/56; 361/91; 361/111
[58] Field of Search ................ 361/18, 96, 111, 91, 361/56

[56] References Cited

U.S. PATENT DOCUMENTS

| | | | |
|---|---|---|---|
| 3,665,222 | 5/1972 | Gatwood | 367/283 |
| 4,186,418 | 1/1980 | Seiler | 361/91 |
| 4,525,765 | 6/1985 | Brajder | 361/88 |
| 4,528,608 | 7/1985 | Andersson et al. | 361/18 |
| 4,589,049 | 5/1986 | Krumrein | 361/56 |
| 4,630,163 | 12/1986 | Cooper et al. | 361/56 |
| 4,816,963 | 3/1989 | Eden | 361/101 |
| 4,849,845 | 7/1989 | Schmitt | 361/56 |
| 4,878,144 | 10/1989 | Nebon | 361/96 |

FOREIGN PATENT DOCUMENTS

| | | |
|---|---|---|
| 0203231 | 3/1986 | European Pat. Off. . |
| 0294887 | 12/1988 | European Pat. Off. . |
| 2176956 | 1/1987 | United Kingdom . |

*Primary Examiner*—Todd E. DeBoer
*Attorney, Agent, or Firm*—Roger L. May; Allan J. Lippa

[57] ABSTRACT

A switching circuit is provided for protecting semiconductors such as switching transistors against transients occurring in system voltage provided by an associated source of electrical energy. The circuit uses one or more avalanche transistors (124, 126, and 128) to apply electrical energy from the source thereof to associated loads (130, 132 and 134) with which they are in series. A processing device (116), which includes a microprocessor (150), monitors the system voltage and generates an output control signal that switches the avalanche transistors into a state of conduction so that the system voltage, including any voltage transients, appears substantially entirely across the loads. Using avalanche transistors as switching transistors provides a significant margin of time for the detection, processing and switching actions to occur without damage being done to the switching transistors by a voltage transient.

15 Claims, 3 Drawing Sheets

5,309,309

SEMICONDUCTOR PROTECTION AGAINST HIGH ENERGY TRANSIENTS

CROSS-REFERENCE TO RELATED APPLICATION

This patent application is a continuation-in-part of U.S. patent application Ser. No. 07/745,621, filed Aug. 15, 1991, now abandoned.

TECHNICAL FIELD

This invention relates to voltage transient protection devices that detect, and protect semiconductors such as switching transistors from, voltage transients.

BACKGROUND ART

This invention includes a second embodiment of a high energy transient semiconductor protection device disclosed in, and this patent application incorporates by reference all material contained in, U.S. patent application Ser. No. 07/745,621, titled *Semiconductor Protection Against High Energy Transients*, filed Aug. 15, 1991. Embodiments of the apparatus disclosed and claimed in the referenced patent application constitute certain of the elements of the combination of the present application.

Electrical transient protection devices have been known for many years. For example, U.S. Pat. No. 4,525,765, issued on Jun. 25, 1985 to Brajder, discloses a protective circuit for a switching transistor. The protective circuit includes a comparator that compares the base-emitter voltage of the switching transistor with a reference voltage. Any increase in the collector current of the switching transistor will be reflected by an increase in base-emitter voltage, the base current remaining constant. Whenever the base-emitter voltage exceeds the reference voltage, the comparator generates an output signal. Driving pulses that switch the switching transistor into and out of a state of conduction are controlled by a device responsive to the output signals from the comparator so that the switching transistor is switched off when its collector current increases above a predetermined level, thereby preventing the flow of excessive current through the transistor.

U.S. Pat. No. 4,816,963, issued on Mar. 28, 1989 to Eden, discloses an apparatus for protecting a transistor when an associated load is shorted. The circuit compares a command voltage with a reference voltage; and the transistor is turned on if the command voltage exceeds the reference voltage and is turned off if the reference voltage exceeds the command voltage. The reference voltage is developed across a capacitor that is charged quickly when the load is shorted and is discharged slowly. This keeps the transistor turned on for short periods and turned off for comparatively long periods, the former being short enough to ensure the protection of the transistor while the load is shorted.

U.S. Pat. No. 4,589,049, issued on May 13, 1986 to Krumrein, discloses a protection circuit for integrated circuits. The protection circuit is connected across the integrated circuit to be protected and includes a first transistor in series with a measuring resistor, the series combination thereof also being connected across the integrated circuit. A zener diode, or its equivalent, is connected between the base and collector of the first transistor so that the latter will conduct if an excessive amount of voltage is applied across the integrated circuit.

Whenever the first transistor conducts, a voltage is developed across the measuring resistor. This voltage is compared to a reference voltage by a comparator the output of which is connected to the base of a second transistor, the collector of which is connected to the base of the first transistor. When the voltage is developed across the measuring resistor, the output of the comparator turns on the second transistor, which renders the first transistor more conductive.

With the first transistor turned on, the series circuit of the first transistor and the measuring transistor shunts current flow therethrough, developing thereacross a relatively low voltage, which is also reflected across the integrated circuit to which it is connected in parallel. A limiting resistor is used between a source of operating potential and the first transistor to develop thereacross a major portion of voltage applied across the series circuit including the limiting resistor, the first transistor and the measuring resistor.

U.S. Pat. No. 4,849,845, issued on Jul. 18, 1989 to Schmitt, disclose transient suppressor for dissipating overvoltages developed across a power supply connected to a load. The transient suppressor senses an overvoltage condition with respect to a reference voltage and turns on a transistor connected across the power supply. The conducting transistor and a resistor connected in series with it across the power supply shunt current flow from the power supply, developing a relatively low voltage across the series circuit and across the integrated circuit to which it is connected in parallel, the resistor dissipating excess electrical energy while the transistor is conducting. When the voltage drops to a level below that of the overvoltage, the transistor is turned off. If the overvoltage continues, the transistor is turned on and off repeatedly. The number of transistor transitions are counted; and, if a predetermined number is exceeded, the operation of the transient suppressor is inhibited and the supply of electrical power is discontinued.

The protective circuits disclosed in the first two patents, to Brajder and Eden respectively, are of the type that turn off the transistors to be protected when an electrical transient is detected. The circuits each require added current-sensing, decision and control circuitry and protect single devices.

The last two patents, to Krumrein and Schmitt respectively, provide clamping circuits that shunt current around circuits to be protected. The Krumrein circuit requires an added overvoltage detector, current measuring circuit, clamping transistor and limiting resistor and protects a single device. The Schmitt patent requires an added overcurrent detector, decision and control circuitry, and clamping hardware.

While each of these protection circuits functions with a certain degree of efficiency, none discloses a device for transistor protection against high energy transients wherein so few elements need to be added to the device to be protected, wherein switching transistors can have relatively low voltage ratings, wherein relatively long applications of high energy transients can be tolerated, wherein a number of devices can be protected by one protection device, and wherein the functions of a processing device, or microcomputer, which may be used for other purposes in an associated circuit, can be shared by the protection device as does the present invention as is hereinafter more fully described.

DISCLOSURE OF INVENTION

An object of the present invention is to provide improved voltage transient protection that requires a minimum number of elements be added to devices to be protected.

Another object of the present invention is to provide improved voltage transient protection that requires the use of switching transistors having lower voltage ratings than those typically required by previous devices.

Yet another object of the present invention is to provide improved voltage transient protection that accommodates a longer application of voltage transients without damaging protected devices.

Still another object of the present invention is to provide improved voltage transient protection that accommodates a number of devices to be protected.

Another object of the present invention is to provide improved voltage transient protection that can use, as part of the protection circuit, a processing device, or microcomputer, used for other purposes in an associated circuit, thereby minimizing the number of additional elements required for the protection circuit.

In realizing the aforementioned and other objects, the present invention includes a transistorized switching circuit that incorporates protection against transient voltage increases occurring in system voltage provided by an associated source of electrical energy. The circuit uses any number of avalanche transistors as a switching device to apply system voltage to a load with which it is in series.

The circuit includes a sensor to monitor the system voltage and a reference voltage and to generate a transient detection signal whenever it detects a transient increase in system voltage. A processing device, or microcomputer, is used to process the transient detection signal and generate an output control signal that switches the avalanche transistors into a state of conduction. The processing device, or microcomputer, can be used for other processing tasks in addition to its application in processing the transient detection signals from the sensor.

With the avalanche transistors in a state of conduction and the resistance thereof being negligible compared to that of the load, the system voltage applied across the series circuit including the load and the avalanche transistors is developed almost entirely across the load. Since the switching transistors are avalanche transistors, sufficient time is provided for the detection, processing and switching actions to occur without damage being done to the switching transistors by the transient increase in system voltage.

A second embodiment includes a combination of similar elements, but it does not include a voltage sensor and requires no reference voltage. Instead, it includes within the processing device a memory, in which is contained a digital signal representing a reference voltage, and an analog-to-digital converter, which receives, and converts to a digital equivalent, an analog voltage representing the system voltage. The digital signal from the memory and the digital equivalent representing the system voltage signal are periodically compared; and, if the latter exceeds the former, indicating that a transient increase in system voltage considered to be threatening has been detected, a microprocessor generates an output control signal that switches the avalanche transistors into a state of conduction.

As mentioned in the previous description of the original embodiment, with the avalanche transistors in a state of conduction and the resistance thereof being negligible compared to that of the load, the voltage applied across the series circuit including the load and the avalanche transistors is developed almost entirely across the load rather than across the transistors.

The objects, features and advantages of the present invention are readily apparent from the following detailed description of the best mode for carrying out the invention when taken in connection with accompanying drawings.

BRIEF DESCRIPTION OF THE DRAWINGS

In the drawings, in which like reference characters indicate corresponding parts in all the views.

BEST MODE FOR CARRYING OUT THE INVENTION

Figure 1:
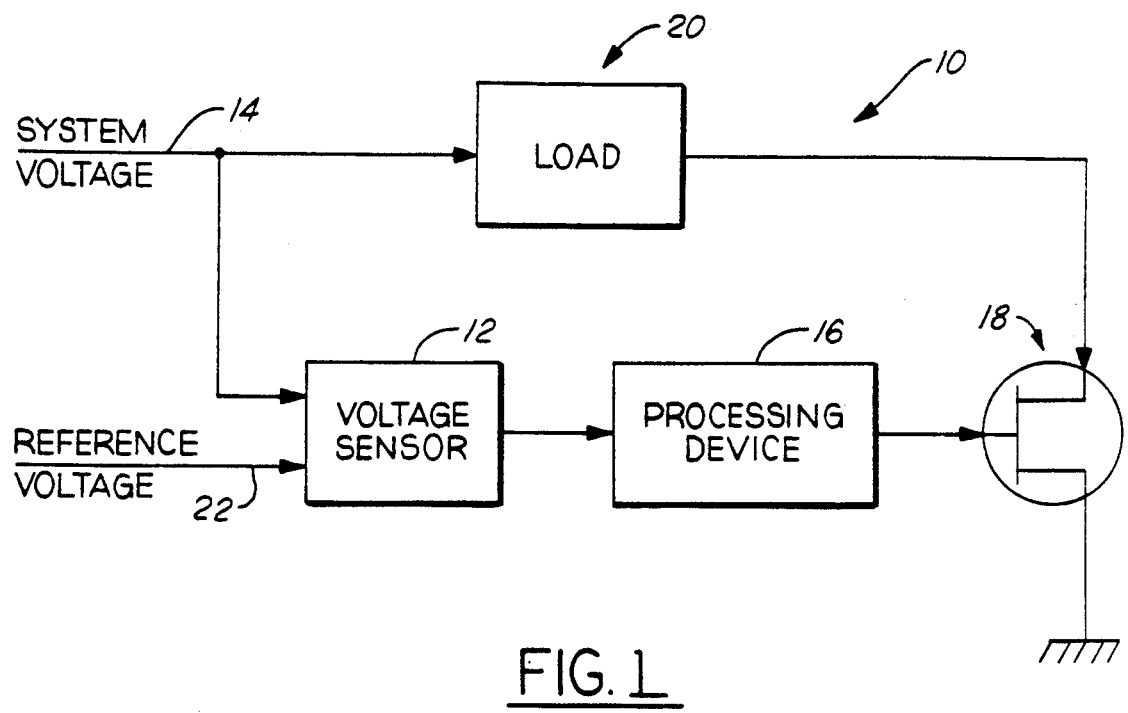
FIG. 1 is a block diagram of a switching circuit incorporating protection against voltage transient increases in system voltage and embodying features of the invention.

With reference to FIG. 1 of the drawings, shown is a switching circuit, generally indicated by reference numeral 10, that includes protection against high energy transient increases in system voltage. The switching circuit 10 includes a voltage sensor 12 connected to a source of electrical energy that provides system voltage, as at reference numeral 14. A processing device, or microcomputer, 16 is connected between the voltage sensor 12 and a switching device, generally indicated by reference numeral 18 and including any number of avalanche-capable field-effect switching transistors. The switching device 18 is connected in series with a load, generally indicated by reference numeral 20, to control the application of system voltage to the load 20. The voltage sensor 12 is also connected to a source of reference voltage, as at reference numeral 22.

The microcomputer 16 need not be one provided exclusively for the switching circuit 10 or exclusively dedicated thereto. Indeed, an advantage of the present method for protecting a switching circuit is that it requires that a minimum of elements be added to existing system circuits to provide the voltage transient protection disclosed. Accordingly, the functions of an existing microcomputer already used in other parts of the system can be shared.

Figure 2:
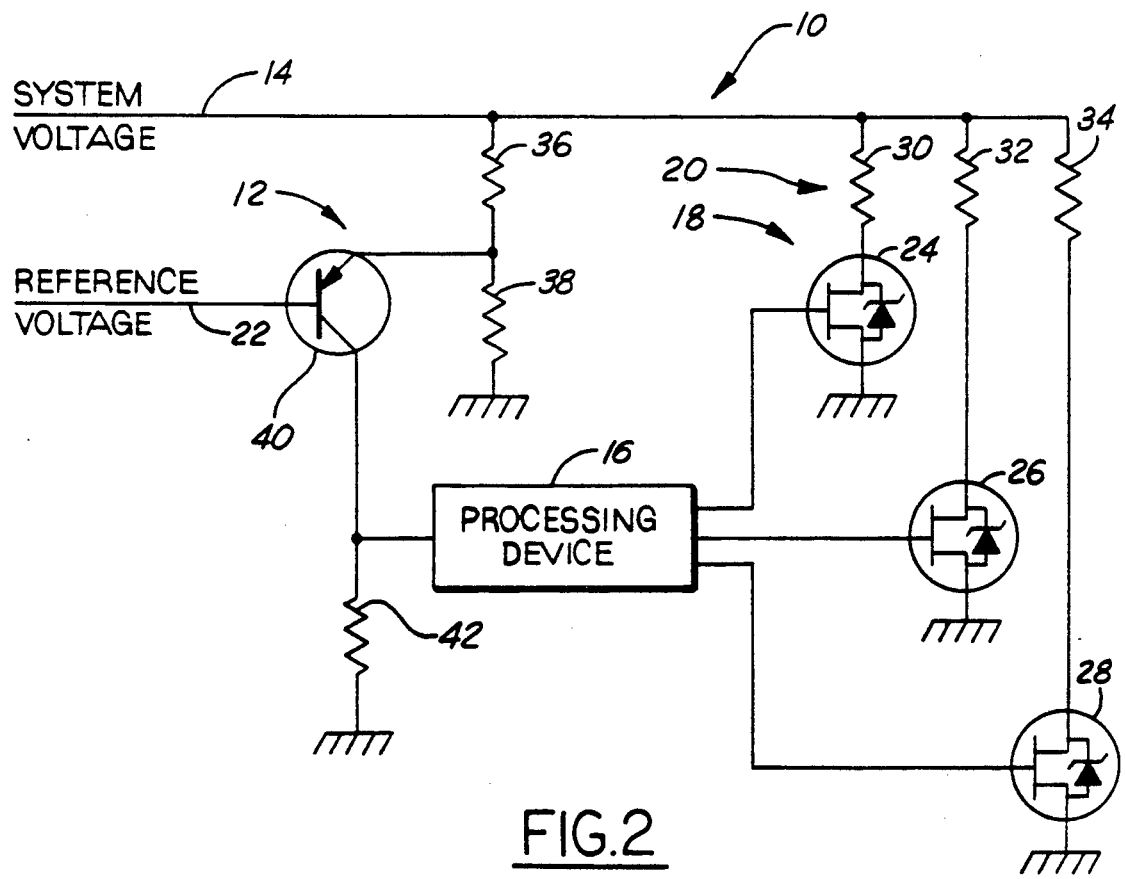
FIG. 2 is a schematic diagram of a circuit similar to that shown by FIG. 1 and having a plurality of protected switching transistors controlling the application of electrical current to a like number of loads.

Shown by FIG. 2 of the drawings is a more detailed diagram of the switching circuit 10. It is basically the switching circuit 10 shown by FIG. 1 but shows a number of individual switching transistors 24, 26 and 28, each having gate, source and drain elements, controlling the application of system voltage to a like number of individual loads 30, 32 and 34 respectively. In the preferred embodiment of the present invention, the switching transistors 24, 26 and 28 are avalanche transistors or other semiconductor devices having similar cascading characteristics including that of initiating a chain generation of hole-electron pairs when operated under relatively high reverse bias voltage conditions. It should be understood that the circuit could include a greater or fewer number of switching transistors 18 and associated loads 20 than shown by FIG. 2.

FIG. 2 also shows the voltage sensor 12 in detail. It includes a voltage divider having a first voltage divider resistor 36 and a second voltage divider resistor 38 connected in series between the source of electrical energy and ground. A sensor transistor 40, having base, emitter and collector elements, is also included in the voltage sensor 12. The base element of the sensor transistor 40 is connected to the source of reference voltage as at reference numeral 22, and the emitter element thereof is connected to a common connection between the first and second voltage divider resistors 36 and 38 respectively. The collector element of the sensor transistor 40 is connected to ground through a sensor resistor 42.

System voltage is divided by the first and second voltage divider resistors, 36 and 38 respectively; and the voltage developed across the latter is input to the emitter of the sensor transistor 40. When the system voltage includes a voltage transient of sufficient amplitude, the emitter-base junction of the sensor transistor 40 becomes forward biased, the sensor transistor 40 conducts; and a transient detection signal is developed across the sensor resistor 42 and is communicated to the microcomputer 16.

During this period, the voltage transient is also felt across the switching transistors 24, 26 and 28, which begin to increase in temperature and to avalanche. While the switching transistors 24, 26 and 28 are reverse biased, their resistance is high; and a substantial portion of the system voltage is developed across them. Accordingly, a substantial portion of the voltage of the transient is also developed across the switching transistors 24, 26 and 28.

The microcomputer 16 converts the analog transient detection signal into a digital signal for processing, generating in response a digital signal that is converted into an analog output control signal, having a duration of 80 milliseconds, that biases the switching transistors 24, 26 and 28 into a state of conduction before the latter have time to become deleteriously overheated. When the switching transistors 24, 26 and 28 begin to conduct, the resistance across each, and therefore the proportional voltage developed across each, decreases. Since the associated loads 30, 32 and 34 now represent essentially all the resistance in each series, load-transistor circuit, substantially all the voltage of the voltage transient is developed across the loads 30, 32 and 34.

After the voltage transient has passed, the voltage developed across the second voltage divider resistor 38 and applied to the emitter element of the sensor transistor 40 is reduced. The emitter-base junction of the sensor transistor 40 becomes reverse biased, and the sensor transistor 40 ceases to conduct. With the sensor transistor 40 in a state of nonconduction, no current flows through the sensor resistor 42. Consequently, no voltage is developed across the sensor resistor 42; and no transient detection signal is communicated to the microcomputer 16.

After a period of 80 milliseconds, if the microcomputer 16 is not receiving the same or a subsequent transient detection signal, it discontinues sending an output control signal to the gate elements of the switching transistors 24, 26 and 28. As a result, the switching transistors 24, 26 and 28 are biased into a state of nonconduction. When the switching transistors 24, 26 and 28 cease conducting, their resistance increases; and a substantial portion of the system voltage is once again developed across them. At this point, the microcomputer 16 need not process any more signals from the voltage sensor 12 until another voltage transient is detected.

Other circuits, using standard transistors, that might attempt to use some of the principles of the present switching circuit protection would require a number of additional circuit components, at additional cost, interconnecting transistor control gates because standard transistors fail quickly if excessive voltage is applied across them. Conversely, the use of avalanche transistors alone would not provide adequate protection either because the voltage of a voltage transient applied thereacross for more than several hundred microseconds could damage even an avalanche transistor.

Required is the combination of the present circuit using avalanche transistors. The avalanche properties of the switching transistors 24, 26 and 28 provide sufficient time for the voltage sensor 12 to sense the voltage transient and generate a transient detection signal and for the microcomputer 16 to process the transient detection signal and bias the switching transistors 24, 26 and 28 into states of conduction before the latter are damaged by the voltage transient.

Figure 3:
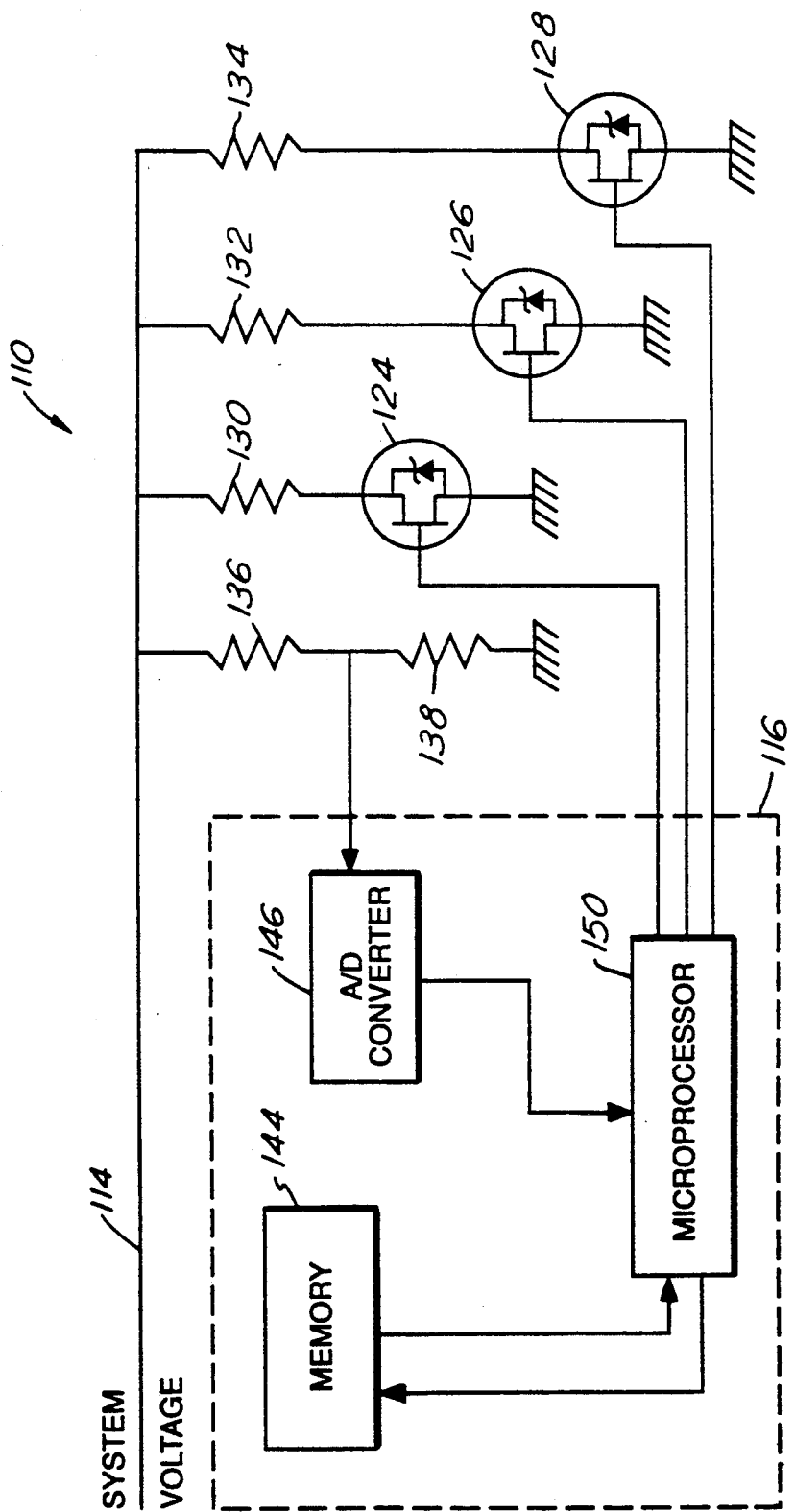
FIG. 3 is a schematic diagram of a second embodiment of a switching circuit incorporating protection against transient increases in system voltage and embodying features of the invention.

With reference to FIG. 3 of the drawings, shown is a second embodiment of a switching circuit, generally indicated by reference numeral 110, incorporating protection against voltage transients. The switching circuit 110 includes a processing device 116 having a memory 144, an analog-to-digital converter 146 and a microprocessor 150. As does the switching circuit 10 of FIG. 2, the switching circuit 110 also includes a plurality of individual switching transistors 124, 126 and 128 controlling the application of system voltage, as at 114, to a like number of individual loads 130, 132 and 134 respectively.

In the second embodiment of the present invention shown by FIG. 3, the switching transistors 124, 126 and 128 are also avalanche transistors or other semiconductor devices having similar cascading characteristics when operated under relatively high reverse bias voltage conditions. As with the previously described switching circuit, it should be understood that the circuit could include a greater or fewer number of switching transistors 124, 126 and 128 and associated loads 130, 132 and 134 than shown by FIG. 3.

The switching circuit 110 also includes a voltage divider having a first voltage divider resistor 136 and a second voltage divider resistor connected in series between the source of electrical energy and ground. A common connection between the first and second voltage divider resistors, 136 and 138 respectively, is connected to the microprocessor 150 through the analog-to-digital converter 146; and the memory 144 is also connected to the microprocessor 150. The microprocessor 150 is also connected to the gate element of each of the switching transistors 124, 126 and 128.

System voltage is divided by the first and second voltage divider resistors, 136 and 138 respectively. The voltage developed across the latter is representative of the system voltage, including any voltage transients thereon; and it is converted from an analog voltage to a digital signal representing the system voltage by the analog-to-digital converter 146. The memory 144 contains a digital signal representing a reference voltage. During each of a continuous series of preselected intervals, the microprocessor 150 interrogates the memory 144 for the digital signal representing the reference voltage. The digital signal representing the reference voltage and the digital signal representing the system voltage are then compared by the microprocessor 150. The frequency with which the digital signals are compared may be any of a range of frequencies, the average frequency used in the preferred embodiment being once every 512 microseconds.

Under normal operating conditions, that is, with no voltage transients imposed on the system voltage, the digital signal representing the reference voltage is greater than the digital signal representing the system voltage. When a voltage transient of transistor-threatening amplitude is present in the system voltage, however, the reverse is true. If a comparison indicates that the digital signal representing the system voltage is greater than the digital signal representing the reference voltage for two consecutive intervals, that is, for 1024 microseconds, the detected voltage transient is considered to represent a danger to the switching transistors 124, 126 and 128.

During this period, the voltage transient is also felt across the switching transistors 124, 126 and 128, which begin to increase in temperature and to avalanche. While the switching transistors 124, 126 and 128 are reverse biased, their resistance is high; and a substantial portion of the system voltage is developed across them. Accordingly, a substantial portion of the voltage of the transient is also developed across the switching transistors 124, 126 and 128.

When a dangerous voltage transient has been detected, the microprocessor 150 generates an analog output control signal, having a duration of 80 milliseconds, that forward biases the switching transistors 124, 126 and 128 into a state of conduction before the latter have time to become damaged by overheating. When the switching transistors 124, 126 and 128 begin to conduct, the resistance across each, and therefore the proportional voltage developed across each, decreases. Since the associated loads 130, 132 and 134 now represent essentially all the resistance in each series, load-transistor circuit, substantially all the voltage of the transient is developed across the loads 130, 132 and 134.

After the voltage transient has passed, the voltage developed across the second voltage divider resistor 138 and applied to the analog-to-digital converter 146 drops to its normal, pretransient level. At this point, the digital signal stored in the memory 144, and representing the reference voltage, is greater than the digital signal representing the system voltage from the analog-to-digital converter 146.

After a period of 80 milliseconds, if the microprocessor 150 is not detecting the same or a subsequent transient voltage, it discontinues sending an output control signal to the gate elements of the switching transistors 124, 126 and 128. As a result, the switching transistors 124, 126 and 128 are reverse biased into a state of nonconduction. When the switching transistors 124, 126 and 128 cease conducting, their resistance increases; and a substantial portion of the system voltage is once again developed across them. At this point, the microprocessor 150 need not process any more signals, which makes the former available for other tasks until another voltage transient is detected.

Figure 4:
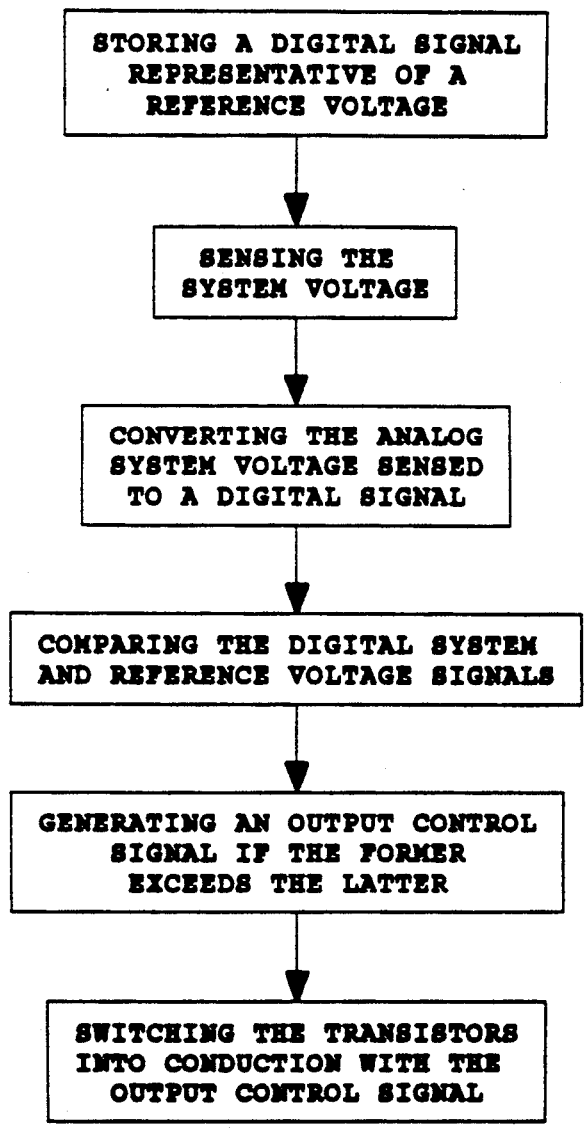
FIG. 4 is a flow diagram depicting the method for using the second embodiment of the switching circuit of the present invention.

With reference to FIGS. 3 and 4 of the drawings, shown is a flow diagram of a method for protecting the switching transistors 124, 126 and 128 of the second embodiment of the switching circuit 110 from transients in the system voltage. The first step includes storing a digital signal representative of the level of a preselected reference voltage in the memory 144. The system voltage is then sensed by applying the system voltage across a pair of series resistors 136 and 138 and taking the voltage developed across the resistor 138 as being an analog voltage representative of the level of the system voltage sensed. A digital signal representative of the system voltage sensed is generated by connecting the voltage developed across the resistor 138 to the analog-to-digital converter 146.

The signal representative of the level of the system voltage sensed is then compared by the microprocessor 150 with the signal representative of the level of the reference voltage, and, if the level of the system voltage represented by the former signal exceeds the level of the reference voltage represented by the latter signal, an output control signal is generated. The last step includes applying the output control signal to each of the respective bases of the switching transistors 124, 126 and 128 to bias them into a state of conduction so that the system voltage, including any voltage transients, essentially appears entirely across the load.

While the best mode for carrying out the invention has been described in detail, those familiar with the art to which this invention relates will recognize various alternative designs and embodiments for practicing the invention as disclosed by the following claims.

We claim:

1. A circuit including a semiconductor switching device having a conductive state and a nonconductive state, the switching device switching a system voltage across a load in series with the switching device, the circuit comprising:

means for generating a signal representative of the level of the system voltage;

storage means for storing a signal representative of the level of a reference voltage; and processing means for processing the signal representative of the level of the system voltage sensed and the signal representative of the level of the reference voltage and for generating, if the level of the system voltage exceeds the level of the reference voltage, an output control signal to switch the semiconductor switching device into its conductive state so that the system voltage, including any voltage transients, appears substantially entirely across the load, wherein the semiconductor switching device includes at least one avalanche-capable field-effect switching transistor.

2. The circuit as defined by claim 1, wherein the means for generating a signal representative of the level of the system voltage comprises:

a voltage divider having a first voltage divider resistor and a second voltage divider resistor connected in series between the source of electrical energy and ground, a voltage representative of the system voltage being developed across the second voltage divider resistor; and an analog-to-digital converter for receiving, and converting to a representative digital signal, analog voltage developed across the second voltage divider resistor.

3. The circuit as defined by claim 1, wherein the processing means for processing the signal representative of the level of the system voltage sensed and the signal representative of the level of the reference voltage and for generating an output control signal if the level of the system voltage represented by the former signal exceeds the level of the reference voltage represented by the latter signal comprises a microprocessor.

4. The circuit as defined by claim 3, wherein the storage means comprises a computer memory.

5. In a circuit having at least one avalanche-capable field-effect switching transistor having a conductive state and a nonconductive state, the transistors switching a system voltage across a load in series with the transistors, a method for protecting the transistors from transients in the system voltage, the method comprising the steps of:
  storing a digital signal representative of the level of a reference voltage;
  sensing the system voltage and developing an analog voltage representative of the level of the system voltage sensed;
  converting the analog voltage to a digital signal representative of the level of the system voltage sensed;
  processing the signal representative of the level of the system voltage sensed and the signal representative of the level of the reference voltage;
  generating, if the level of the system voltage represented by the former signal exceeds the level of the reference voltage represented by the latter signal, an output control signal; and
  switching into a state of conduction, with the output control signal, each transistor so that the system voltage, including any voltage transients, essentially appears entirely across the load.

6. A circuit having a semiconductor switching device including an avalanche-capable field-effect switching transistor having a conductive state and a nonconductive state, the switching device switching a system voltage across a load in series with the switching device, the circuit comprising:
  means for generating a transient detection signal as a function of a transient appearing in the system voltage; and
  a microcomputer for processing the transient detection signal and providing an output control signal to the switching device to switch the switching device into its conductive state so that the system voltage, including any voltage transients, appears substantially entirely across the load.

7. The circuit as defined by claim 6, wherein the means for generating a transient detection signal comprises:
  a source for providing a reference voltage that maintains a level equal to that of normal system voltage;
  a voltage divider having a first voltage divider resistor and a second voltage divider resistor connected in series between the source of electrical energy and ground;
  a sensor transistor having base, emitter and collector elements, the base element being connected to the source of reference voltage, the emitter element being connected to a common connection between the first and second voltage divider resistors, and the collector element being connected to the means for processing the transient detection signal, the emitter-base junction of the sensor transistor being forward biased whenever the system voltage includes a voltage transient of sufficient amplitude, at which time the sensor transistor conducts; and
  a sensor resistor connected between the collector element of the sensor transistor and ground, a transient detection signal being developed across the sensor resistor and communicated to the means for processing the transient detection signal whenever the sensor transistor conducts.

8. The circuit as defined by claim 7 wherein the means for processing the transient detection signal comprises a microcomputer.

9. A circuit having protection from system voltage transients, the circuit switching a system voltage across a load, the circuit comprising:
  a switching device including an avalanche-capable field-effect switching transistor and having a conductive state and a nonconductive state;
  means for generating a transient detection signal as a function of a transient appearing in the system voltage; and
  a microprocessor for processing the transient detection signal and providing an output control signal to the switching device to switch the switching device into its conductive state so that the system voltage, including any voltage transients, appears substantially entirely across the load.

10. The circuit as defined by claim 9, wherein the means for generating a transient detection signal comprises:
  a source for providing a reference voltage that maintains a level equal to that of normal system voltage;
  a voltage divider having a first voltage divider resistor and a second voltage divider resistor connected in series between the source of electrical energy and ground;
  a sensor transistor having base, emitter and collector elements, the base element being connected to the source of reference voltage, the emitter element being connected to a common connection between the first and second voltage divider resistors, and the collector element being connected to the means for processing the transient detection signal, the emitter-base junction of the sensor transistor being forward biased whenever the system voltage includes a voltage transient of sufficient amplitude, at which time the sensor transistor conducts; and
  a sensor resistor connected between the collector element of the sensor transistor and ground, a transient detection signal being developed across the sensor resistor and communicated to the means for processing the transient detection signal whenever the sensor transistor conducts.

11. The circuit as defined in claim 10, wherein the means for processing the transient detection signal comprises a microcomputer.

12. In a circuit having at least one avalanche-capable field-effect switching transistor having a conductive state and a nonconductive state, the transistors switching a system voltage across a load in series with the transistors, a method for protecting the transistors from transients in the system voltage, the method comprising the steps of:
  comparing the system voltage to a reference voltage to detect a transient in the system voltage;

generating a transient detection signal in response to detecting a transient;

processing the transient detection signal to produce an output control signal in response thereto; and switching into a state of conduction, with the output control signal, each transistor so that the system voltage, including any voltage transients, appears substantially entirely across the load.

13. In a circuit having at least one avalanche-capable field-effect switching transistor having a conductive state and a nonconductive state, the transistors switching a system voltage across a load in series with the transistors, a system for protecting the transistors from transients in the system voltage, the system comprising:

means for comparing the system voltage to a reference voltage to detect transients in the system voltage;

means for generating a transient detection signal in response to detecting a transient;

a microprocessor for processing the transient detection signal to produce an output control signal in response thereto; and means for switching into a state of conduction, with the output control signal, each transistor, so that the system voltage, including any voltage transients, appears substantially entirely across the load.

14. The system as defined in claim 13, wherein the means for comparing the system voltage to a reference voltage comprises:

a voltage divider having a first voltage divider resistor and a second voltage divider resistor connected in series between the source of electrical energy and ground; and a sensor transistor having base, emitter and collector elements, the base element being connected to the source of reference voltage, the emitter element being connected to a common connection between the first and second voltage divider resistors, and the collector element being connected to the microcomputer for processing the transient detection signal, the emitter-base junction of the sensor transistor being forward biased whenever the system voltage includes a voltage transient of sufficient amplitude, at which time the sensor transistor conducts.

15. The system as defined by claim 14, wherein the means for generating a transient detection signal comprises a sensor resistor connected between the collector element of the sensor transistor and ground, the transient detection signal being developed across the sensor resistor and communicated to the means for processing the transient detection signal whenever the sensor transistor conducts.

* * * * *